(12) United States Patent
Sabathil et al.

(10) Patent No.: US 9,691,741 B2
(45) Date of Patent: Jun. 27, 2017

(54) METHOD FOR PRODUCING OPTOELECTRONIC SEMICONDUCTOR COMPONENTS AND OPTOELECTRONIC SEMICONDUCTOR COMPONENT

(71) Applicant: OSRAM Opto Semiconductors GmbH, Regensburg (DE)

(72) Inventors: Matthias Sabathil, Regensburg (DE); Frank Singer, Regenstauf (DE); Roland Hüttinger, Kaufering (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/100,559

(22) PCT Filed: Jan. 13, 2015

(86) PCT No.: PCT/EP2015/050477
§ 371 (c)(1),
(2) Date: May 31, 2016

(87) PCT Pub. No.: WO2015/107038
PCT Pub. Date: Jul. 23, 2015

(65) Prior Publication Data
US 2016/0300820 A1   Oct. 13, 2016

(30) Foreign Application Priority Data

Jan. 20, 2014 (DE) .................. 10 2014 100 584

(51) Int. Cl.
*H01L 25/075* (2006.01)
*H01L 33/00* (2010.01)
(Continued)

(52) U.S. Cl.
CPC ............ *H01L 25/0753* (2013.01); *F21K 9/90* (2013.01); *H01L 33/0095* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 2009/0114928 A1 | 5/2009 | Messere et al. | |
| 2010/0109036 A1 | 5/2010 | Chen et al. | |

(Continued)

FOREIGN PATENT DOCUMENTS

| | | | |
|---|---|---|---|
| DE | 102011085645 A1 | 5/2013 | |
| JP | 2005072129 A | 3/2005 | |

(Continued)

*Primary Examiner* — Mamadou Diallo
(74) *Attorney, Agent, or Firm* — Slater Matsil, LLP

(57) ABSTRACT

A method for producing optoelectronic semiconductor components and an optoelectronic semiconductor component are disclosed. In an embodiment the method includes: A) creating a blank by pultrusion from a glass melt, B) shaping the blank into a billet-shaped optical element with a longitudinal axis, the optical element having a mounting side and a light outlet side, C) producing conductor tracks on the mounting side, D) mounting a plurality of optoelectronic semiconductor chips on the mounting side of the optical element and connecting them to the conductor tracks and E) separating the optical element into the optoelectronic semiconductor components, wherein each optoelectronic semiconductor component comprises at least two of the semiconductor chips, and wherein at least steps A) to D) are performed in the stated sequence.

16 Claims, 5 Drawing Sheets

(51) Int. Cl.

| | | |
|---|---|---|
| *F21K 9/90* | (2016.01) | |
| *H01L 33/58* | (2010.01) | |
| *H01L 33/50* | (2010.01) | |
| *H01L 33/56* | (2010.01) | |
| *H01L 23/00* | (2006.01) | |
| *F21Y 103/10* | (2016.01) | |
| *F21Y 115/10* | (2016.01) | |

(52) U.S. Cl.
CPC ............ *H01L 33/502* (2013.01); *H01L 33/56* (2013.01); *H01L 33/58* (2013.01); *F21Y 2103/10* (2016.08); *F21Y 2115/10* (2016.08); *H01L 24/29* (2013.01); *H01L 24/32* (2013.01); *H01L 24/83* (2013.01); *H01L 24/97* (2013.01); *H01L 2224/291* (2013.01); *H01L 2224/2919* (2013.01); *H01L 2224/32227* (2013.01); *H01L 2224/83801* (2013.01); *H01L 2224/83851* (2013.01); *H01L 2224/97* (2013.01); *H01L 2924/15159* (2013.01); *H01L 2933/005* (2013.01); *H01L 2933/0041* (2013.01); *H01L 2933/0091* (2013.01)

(56) References Cited

U.S. PATENT DOCUMENTS

| | | |
|---|---|---|
| 2011/0058372 A1 | 3/2011 | Lerman et al. |
| 2013/0329414 A1* | 12/2013 | Kusunose ................. F21K 9/27 362/223 |
| 2014/0285088 A1 | 9/2014 | Windisch |

FOREIGN PATENT DOCUMENTS

| | | |
|---|---|---|
| WO | 2006126123 A1 | 11/2006 |
| WO | 2007045786 A1 | 4/2007 |
| WO | 2011158160 A1 | 12/2011 |
| WO | 2013066920 A2 | 5/2013 |

\* cited by examiner

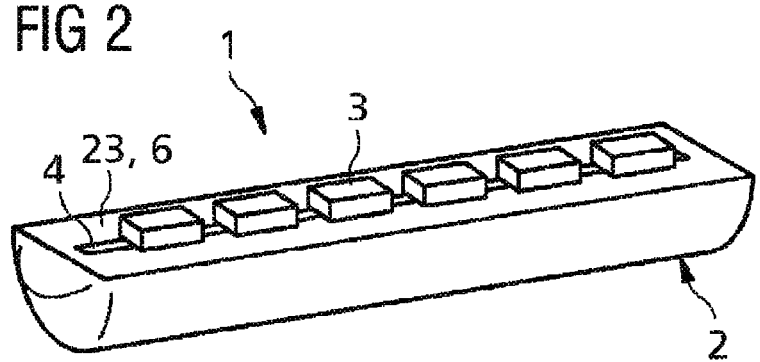
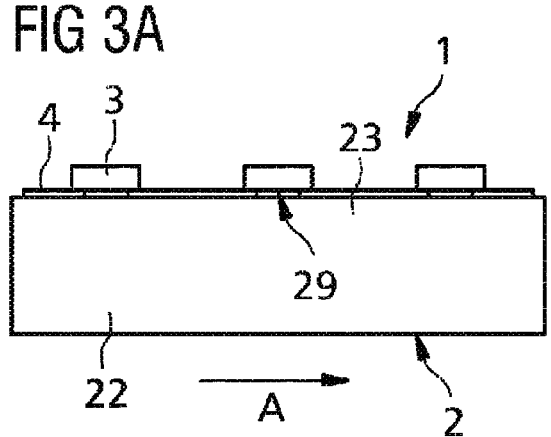
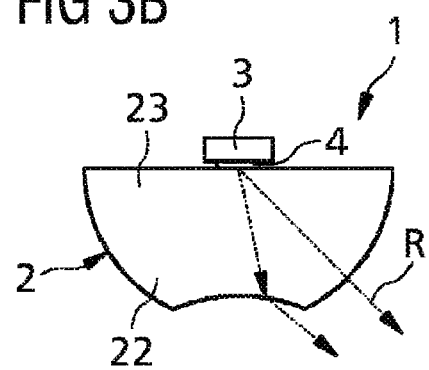
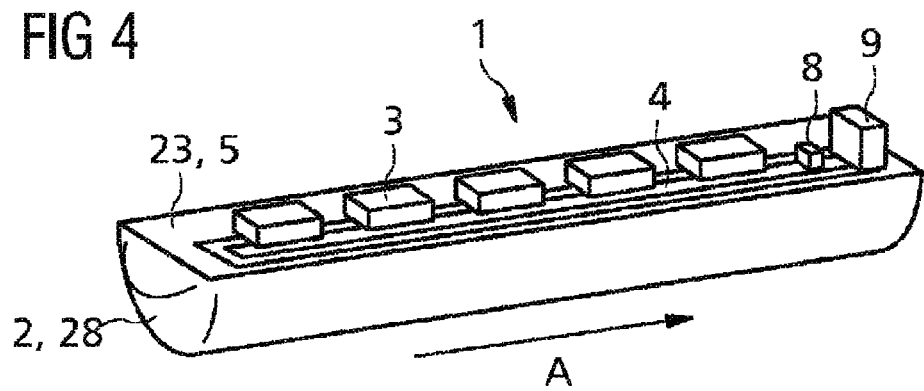

FIG 8A
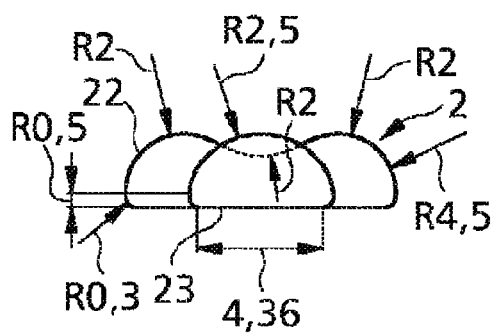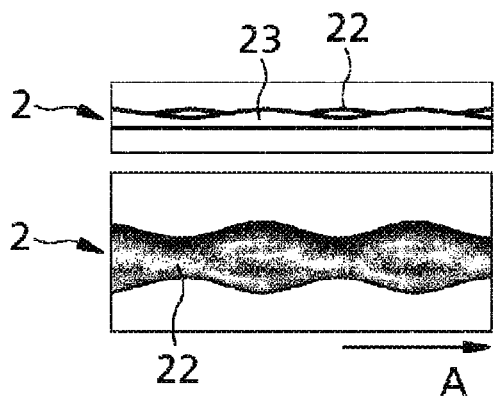
FIG 8B
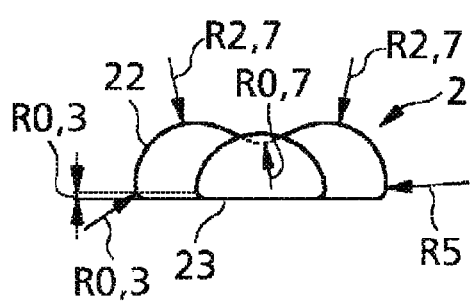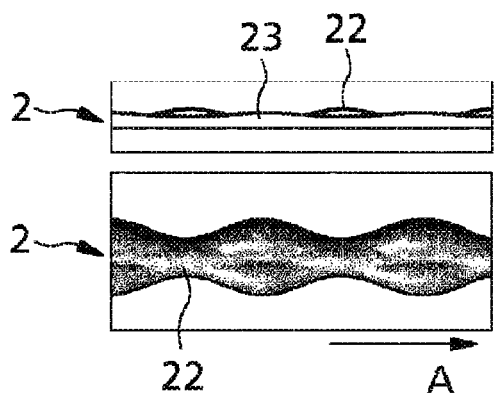
FIG 8C
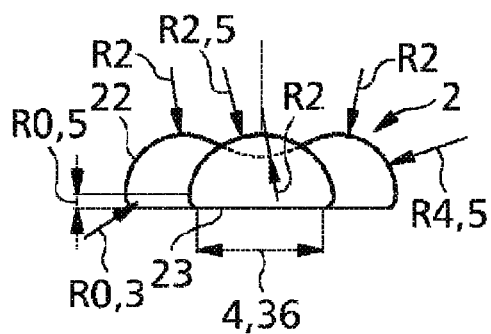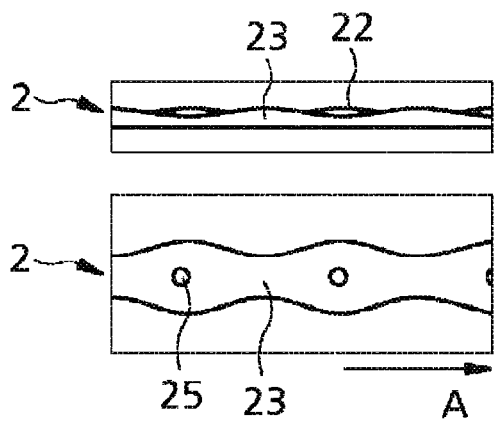

METHOD FOR PRODUCING OPTOELECTRONIC SEMICONDUCTOR COMPONENTS AND OPTOELECTRONIC SEMICONDUCTOR COMPONENT

This patent application is a national phase filing under section 371 of PCT/EP2015/050477, filed Jan. 13, 2015, which claims the priority of German patent application 10 2014 100 584.8, filed Jan. 20, 2014, each of which is incorporated herein by reference in its entirety.

TECHNICAL FIELD

A method is provided for producing optoelectronic semiconductor components. An optoelectronic semiconductor component is also provided.

SUMMARY OF THE INVENTION

Embodiments provide a method with which optoelectronic semiconductor components can be efficiently produced.

According to at least one embodiment, the method is configured to produce optoelectronic semiconductor components. Preferably, a plurality of the semiconductor components are produced using the method. The semiconductor components are preferably each configured to emit light, in particular visible light. For example, the optoelectronic semiconductor components are luminaires or modules for luminaires.

According to at least one embodiment, the method comprises the step of creating a blank. The blank is produced in particular by pultrusion or extrusion from a material melt. Using such methods, blanks can be produced in virtually any desired lengths.

According to at least one embodiment, the method comprises the step of shaping the blank. The blank is shaped into a billet-shaped optical element. The blank is preferably shaped after creation of the blank and with a dedicated tool. Alternatively, it is possible for shaping to take place at the same time as creation, for example by a specially shaped pultrusion or extrusion die.

According to at least one embodiment, the optical element has a longitudinal axis. The longitudinal axis extends in a longitudinal direction of the optical element along which said optical element has its greatest geometric extent. The longitudinal axis may extend along a straight line. For example, the longitudinal axis extends within a plane of symmetry of the optical element. The optical element preferably comprises one or two planes of symmetry.

According to at least one embodiment, the optical element has a mounting side. The mounting side is configured such that further elements of the semiconductor components may be mounted on the mounting side. Likewise, the mounting side may be configured for mounting the optical element on a further part such as an external carrier.

According to at least one embodiment, the optical element comprises a light outlet side. The light outlet side is configured for beam shaping. For example, the light outlet side is curved. The light outlet side may be shaped like a lens or a plurality of lenses.

According to at least one embodiment, the method comprises the step of producing conductor tracks on the mounting side. Via the conductor tracks on the mounting side, an electrical interconnection may be produced within the semiconductor components.

According to at least one embodiment, the method comprises the step of mounting a plurality of optoelectronic semiconductor chips on the mounting side. The semiconductor chips may be attached directly or indirectly to the mounting side. In particular, the semiconductor chips are connected electrically, and preferably also mechanically, to the conductor tracks on the mounting side. It is possible for the semiconductor chips to be fastened to the optical element only via the conductor tracks.

According to at least one embodiment, the semiconductor chips are light-emitting diodes or light-emitting diode chips. These may be packaged or, preferably, unpackaged light-emitting diode chips. The semiconductor chips are configured, for example, to generate blue, green, yellow, red and/or white light. The semiconductor chips mounted on the mounting side for radiation emission may be solely of like construction or of different types.

According to at least one embodiment, the method comprises the step of splitting the optical element into the optoelectronic semiconductor components. The semiconductor components may here have the same or indeed different lengths. Splitting them may be performed by sawing, laser cutting, scribing and breaking or snapping off.

According to at least one embodiment, the optoelectronic semiconductor components each comprise at least two or more than of the two semiconductor chips. For example, the semiconductor components comprise at least five or eight or ten or twenty or one hundred or five hundred and/or at most one thousand or two hundred or one hundred or fifty of the semiconductor chips.

According to at least one embodiment, the optical element is the mechanically load-bearing part of the finished semiconductor components, in particular the only mechanically load-bearing part. In other words, the optical element is self-supporting and mechanically stable. Without the optical element, the semiconductor components would be mechanically unstable and could not be handled alone.

In at least one embodiment, the method is configured to produce optoelectronic semiconductor components. The method comprises at least the following steps:

A) creating a blank by pultrusion or extrusion from a material melt,

B) shaping the blank into a billet-shaped optical element with a longitudinal axis and with a mounting side and with a light outlet side, C) producing conductor tracks on the mounting side, D) mounting a plurality of optoelectronic semiconductor chips on the mounting side of the optical element and connecting them to the conductor tracks, and E) splitting the optical element into the optoelectronic semiconductor components.

In various embodiemnts the optoelectronic semiconductor components here each comprise at least two of the semiconductor chips and the optical element is the mechanically load-bearing and stabilizing part of the semiconductor components.

In various embodiments linear luminaires are of interest for numerous lighting applications. For example, linear luminaires may be used for area lighting for instance in open plan offices, for backlighting of display devices or indeed in light boxes for instance for outdoor advertising. Linear lamps may also be used to illuminate linear areas or areas of linear configuration, for example in gangways in an aircraft cabin.

In various embodiments linear light sources generally take the form of fluorescent tubes. However, fluorescent tubes have comparatively large and standardized external dimensions, conventionally known as $T_5$ to $T_{12}$. In addition, fluorescent tubes can generally only be used in continuous operation and normally cannot be adjusted, or only adjusted to a limited degree, with regard to emitted intensity and color location of the emitted light.

According to at least one embodiment, at least the above-stated method steps A) to D) take place in the stated sequence. The method steps A) to E) may likewise be carried out in the sequence described.

According to at least one embodiment, at least method steps B) and C) and optionally also method steps D) and/or E) take place during cooling after step A). In particular, method steps B) and C) take place at a temperature of at least 110° C. or 140° C. The fact that the method steps in question take place during cooling may mean that no additional heating takes place and that in the sequence of the method steps the temperature of the blank and of the optical element decreases monotonically or strictly monotonically.

According to at least one embodiment, the blank is formed from a glass. In particular, the blank is made from a low-melting glass. For example, the low-melting glass is a silicate glass, a borate glass or a phosphate glass. The silicate glass contains as its main constituent $SiO_2$, the borate glass contains as its main constituent $B_2O_3$ and the phosphate glass contains as its main constituent $P_2O_5$. The silicate glass may contain further metal oxides such as $B_2O_3$, $P_2O_5$, $Na_2O$, $K_2O$ and/or AgO, the borate glass may contain further metal oxides such as $SiO_2$, $P_2O_5$, $Na_2O$, $K_2O$, PbO and AgO and the phosphate glass may contain further metal oxides such as $B_2O_3$, $SiO_2$, $Na_2O$, $K_2O$ and/or AgO. The AgO content is for example at least 20 wt. % or 40 wt. %. The inorganic glass is a soda-lime glass, for example.

According to at least one embodiment, the optical element is made from a plastics material. For example, the optical element comprises or consists of polymethyl methacrylate, polystyrene, cyclo olefin copolymers or polycarbonate.

It is also possible for a plurality of materials to be used in combination for the optical element. Preferably, in each case transparent materials are used for the optical element which are not or are not significantly absorbing in the emission spectrum generated by the semiconductor component and which are preferably also aging-resistant relative to the radiation generated. In particular, the optical element is homogeneous with regard to its material composition, such that no fluctuations in material composition occur across the optical element.

According to at least one embodiment, the conductor tracks are adhered or printed onto the mounting side. In particular, an ink is used which comprises silver and/or copper, for example in the form of particles, in particular in the form of nanoparticles.

According to at least one embodiment, after application, in particular after printing on, the conductor tracks are formed or cured by sintering. Sintering preferably proceeds without additional heating solely on the basis of the temperature of the optical element during cooling.

According to at least one embodiment, at least one luminescent material is applied to the mounting side in places or over the entire surface. Preferably, a combination of at least two luminescent materials is applied. Application of the at least one luminescent material preferably proceeds between steps B) and C).

According to at least one embodiment, application of the at least one luminescent material proceeds at a temperature of at least 350° C. or 400° C. or 500° C. Alternatively or in addition, application proceeds at a temperature of at most 650° C. or 600° C. or 560° C.

According to at least one embodiment, the luminescent material sinks at least partly into the optical element after application. In other words, the luminescent material does not then lie on the mounting side, but rather it lies between the mounting side and the light outlet side.

According to at least one embodiment, the at least one luminescent material is present in the form of particles. Preferably, the particles have a comparatively large average diameter. In particular, the average diameter is at least 3 µm or 5 µm or 7 µm and/or at most 50 µm or 15 µm.

According to at least one embodiment, one of the luminescent materials is or comprises or the one luminescent material is a nitride or an oxynitride. In particular, this luminescent material is a red-emitting luminescent material. In other words, the luminescent material then preferably converts blue and/or green light into red light.

According to at least one embodiment, the mounting side, which is opposite the light outlet side, is a smooth side. In other words, the mounting side is then planar in shape. Alternatively, it is possible for the mounting side to be slightly curved. Slightly curved may mean a radius of curvature of at least 25 mm or 50 mm or 100 mm. Alternatively or in addition, the radius of curvature is above an average diameter of the optical element at least by a factor of 5 or 10 or 20.

According to at least one embodiment, a plurality of blind holes are formed in the mounting side. The term "blind hole" means that the corresponding hole does not extend as far as the light outlet side.

According to at least one embodiment, one or a plurality of the semiconductor chips is/are inserted into each one of the blind holes. Electrical leads and/or contacts of the semiconductor chips are preferably located outside the blind holes on the mounting side. It is thus possible for mechanical and electrical fastening of the semiconductor chips to take place outside the blind holes. Alternatively, the electrical leads and/or contacts of the semiconductor chips may also be located within the blind holes. The semiconductor chips may be fitted mechanically directly into the blind holes and simultaneously electrically connected.

According to at least one embodiment, the semiconductor chip are "sapphire chips", which have a particularly radiation-transmissive sapphire growth substrate for a semiconductor layer sequence of the semiconductor chip. The semiconductor chips may likewise be flip chips.

According to at least one embodiment, a filling medium is situated between the semiconductor chips and the mounting side. Such a filling medium allows the light outcoupling efficiency of radiation from the semiconductor chip into the optical element to be increased. For example, the blind holes are then completely filled in by the semiconductor chips and the filling medium. The filling medium may be a silicone. The filling medium may optionally also serve in additional fastening of the semiconductor chips to the optical element.

According to at least one embodiment, in step B) the blank is shaped with forming rollers. The forming rollers may at the same time be structured such that along the longitudinal axis of the optical element the cross-section varies, preferably periodically, in a direction perpendicular to the longitudinal axis. In this way, the optical characteristics of the optical element may be produced in an efficient and purposefully varied manner.

According to at least one embodiment, the optical element comprises respectively concavely and convexly curved regions of the light outlet side both in at least one cross-section parallel to the longitudinal axis and in a cross-section perpendicular to the longitudinal axis. It is then possible for the optical element to comprise cross-sections in a direction perpendicular to the longitudinal axis which merely exhibit a convexly curved light outlet side. Along the longitudinal axis the optical element preferably comprises a plurality of convexly curved regions and a plurality of concavely curved regions.

According to at least one embodiment, the mounting side is provided with a mirror layer in regions which are not covered by the semiconductor chips. The mirror layer may be a metallic layer. It is possible for the conductor tracks to be produced from the mirror layer. The conductor tracks are then preferably separated from remaining regions of the mirror layer by thin, narrow gaps, such that no electrical short circuits arise.

According to at least one embodiment, the semiconductor chips are arranged on the mounting side along the longitudinal axis in one or a plurality of rows. The semiconductor chips are preferably arranged in a regular pattern.

According to at least one embodiment, the finished semiconductor component comprises semiconductor chips emitting in the red region of the spectrum and semiconductor chips emitting in the blue region of the spectrum, in particular red light-emitting diodes and blue light-emitting diodes. The red-emitting and the blue-emitting semiconductor chips are preferably arranged alternately in a regular pattern along the longitudinal axis on the mounting side. It is not essential in this respect for precisely one blue-emitting semiconductor chip to follow one red-emitting semiconductor chip and vice versa. The semiconductor chips may be grouped by color of emission, such that a plurality of blue-emitting semiconductor chips follow one or more red-emitting semiconductor chips.

According to at least one embodiment, a scattering medium for light scattering and/or the at least one luminescent material is/are located between the semiconductor chips and the light outlet side and/or between the semiconductor chips and the mounting side. The scattering medium, which is formed for example by a layer of light-scattering particles, enables an emission pattern of the semiconductor component to be purposefully adjusted.

According to at least one embodiment, a protective device for protecting against damage caused by electrostatic discharges is located on the mounting side. The protective device may be applied in or after step D). Alternatively or in addition, a plug connector for connection and for external electrical contacting of the semiconductor component may be located in particular on the mounting side or at end faces of the optical element.

According to at least one embodiment, step E) directly follows step B) or is incorporated into step B). The end faces of the optical element may in this case be provided in step E) with an optically active curvature, in particular with a convex curvature. If the optical element is split and shaped from the blank, subsequent splitting in particular using a cutting method or a material-removing method may be avoided.

An optoelectronic semiconductor component is furthermore provided. The semiconductor component is produced in particular using a method as indicated in conjunction with one or more of the above-stated embodiments. Features of the method are therefore also disclosed for the semiconductor component and vice versa.

According to at least one embodiment of the semiconductor component, the length of the semiconductor component is greater than the width of the semiconductor component at least by a factor of 8 or 10 or 12 or 20. The length and width are here determined in particular in plan view onto the light outlet side of the optical element. The length is preferably measured along the longitudinal axis.

According to at least one embodiment, a width and/or length of the optical element is equal to the length and/or width of the semiconductor component, when viewed in plan view onto the mounting side and/or the light outlet side. In other words, the size of the semiconductor component, when viewed in plan view onto the light outlet side and/or onto the mounting side, may then be predetermined by the optical element.

BRIEF DESCRIPTION OF THE DRAWINGS

A method described here and an optoelectronic semiconductor component described here will be explained in greater detail below with reference to the drawings and with the aid of exemplary embodiments. Elements which are the same in the individual figures are indicated with the same reference numerals. The relationships between the elements are not shown to scale however, unless otherwise indicated, but rather individual elements may be shown exaggeratedly large to assist in understanding.

In the figures:

FIG. 1, which includes FIG. 2 shows a perspective representation of an exemplary embodiment of the semiconductor component, FIG. 3, which includes Figures 3A-3B, shows sectional representations of an exemplary embodiment of the semiconductor component, FIG. 4 shows a perspective representation of a further exemplary embodiment of the semiconductor component, FIGS. 8A-8C, shows schematic representations of optical elements for optoelectronic semiconductor components described here.

DETAILED DESCRIPTION OF ILLUSTRATIVE EMBODIMENTS

FIG. 1 shows schematic perspective representations illustrating a method for producing optoelectronic semiconductor components 1.

Figure 1A:
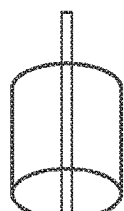
FIGS. 1A-1G, shows an exemplary embodiment of a production method for semiconductor components described here.
Figure 1B:
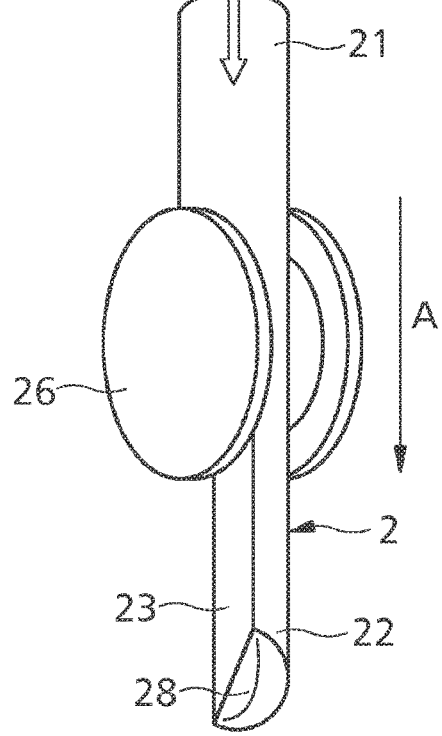

FIGS. 1A and 1B show that a blank 21 for an optical element 2 is shaped from a melt by pultrusion. The blank 21, which for example is drawn from a melt and which is in particular formed homogeneously from a glass, is brought into the desired shape by forming rollers 26.

The optical element 2 comprises a mounting side 23, which is planar or substantially planar in form. Opposite the mounting side 23 is a light outlet side 22, which is curved. Beam shaping is performed by the optical element 2 by way of the light outlet side 22. Perpendicular to a longitudinal axis A of the optical element 2 when viewed in cross-section, said element is for example semicircular in shape.

It is optionally possible for the optical element 2 to be split and cut to length during shaping. In this case, end faces 28 may be purposefully provided with optically active rounding or an optically active shape.

Pultrusion from the melt and shaping with the forming rollers 26, of which there are for example two, is in particular a continuous process, with which a blank and an optical element 2 may be produced with as far as possible freely selectable lengths. The step of drawing the viscous material for the blank 21 from a melt, in particular from a melter, proceeds for example at a temperature of roughly 950° C. Shaping of the blank 21 with the forming rollers 26 to yield the optical element 2 proceeds for example at a temperature of roughly 650° C. Due to use of the forming rollers 26, the optical element 2 may be produced without lateral seams and gates, unlike for example when compression molding or injection molding are used.

Figure 1C:
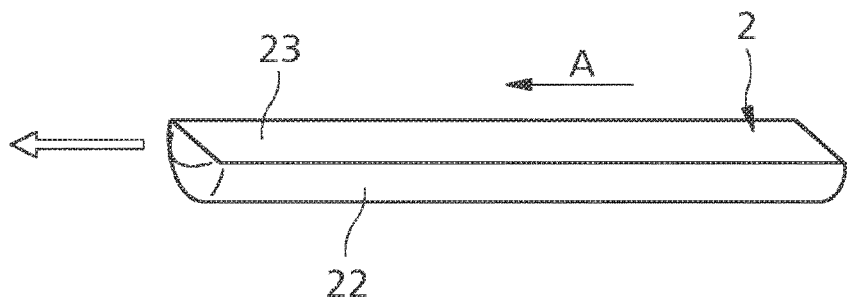

FIG. 1C shows that after shaping the optical element 2 is diverted, cooled further and preferably conveyed on in the same production line. Transfer to another production facility is preferably not necessary.

During the cooling phase of the optical element, the latter may be constantly drawn on further along a cooling section and the further process steps may be performed along this cooling section. The temperature prevailing at the respective processing site may thus be utilized. For example, according to the optional method step shown in FIG. 1D, particles of a luminescent material 5 are sprayed onto the mounting side 23 with a nozzle 50. In this process step the optical element 2 preferably has a temperature of between 500° C. and 600° C. inclusive, for example of roughly 550° C. This makes it possible for the particles of the luminescent material 5 to sink purposefully into the optical element 2.

Figure 1D:
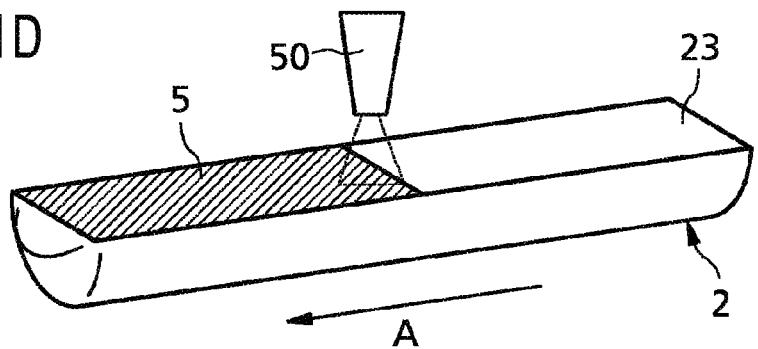

It is optionally possible for further rolling of the optical element 2 to take place, after the step in FIG. 1D, to make it easier for the particles of the luminescent material 5 to sink in or to smooth the mounting side 23. Alternatively, it is furthermore possible for the luminescent material 5 to be applied as early as in or prior to the step according to FIG. 1B.

Figure 1E:
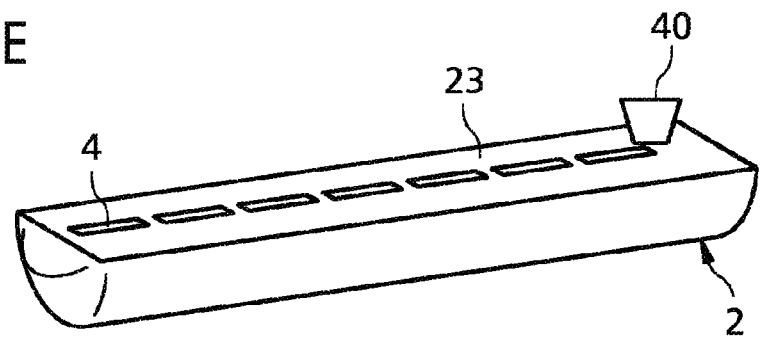

In the method step according to FIG. 1E, structured conductor tracks 4 are applied to the mounting side 23 using a printing nozzle 40. This method step preferably takes place at a temperature of roughly 150° C. In this way, sinter-bonding and/or curing of an ink for the conductor tracks 4 is possible during continued cooling of the optical element 2.

Figure 1F:
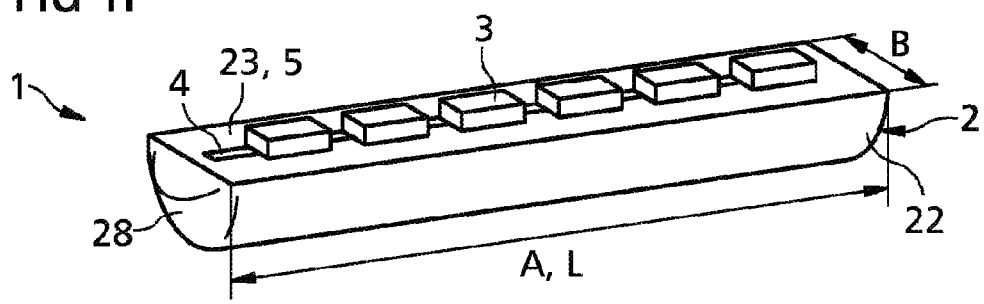

In the method step according to FIG. 1F, optoelectronic semiconductor chips 3, in particular light-emitting diode chips, are applied to the mounting side 23 and to the luminescent material 5. Application of the semiconductor chips 3 proceeds for example by means of soldering or by means of electrically conductive adhesion.

The semiconductor chips 3 in this case comprise a main emission direction towards the mounting side 23. Both electrical contacts of the semiconductor chips 3 are preferably located on a side of the semiconductor chips 3 facing the mounting side 23. The semiconductor chips 3 are preferably unpackaged chips. The semiconductor chips 3 may be interconnected with the conductor tracks 4 to yield one or more series circuits and/or also to yield one or more parallel circuits.

As preferably also in all other exemplary embodiments, the optical element 2 comprises a comparatively long length L along the longitudinal axis A and a comparatively small width B in the direction perpendicular to the longitudinal axis A. The length L exceeds the width B for example by at least a factor of 8 or 12 or 20. It is possible for the length L to be at least 6 cm or 10 cm or 15 cm and/or at most 2 m or 60 cm or 30 cm. The width B and/or an average diameter of the optical element 2 is/are in particular at least 2 mm or 5 mm and/or at most 30 mm or 10 mm.

Figure 1G:
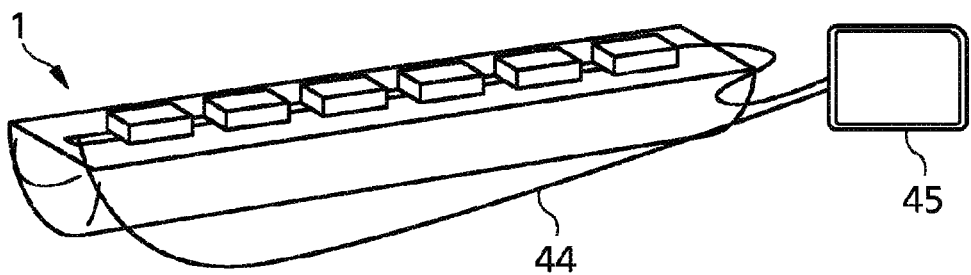

FIG. 1G shows connection of the semiconductor component 1. Via electrical lines 44 at both end faces of the optical element 2, the semiconductor component 1 is connected to driving electronics 45, for example to an electrical ballast. The driving electronics 45 make the semiconductor component 1 electrically drivable and operable.

FIG. 2 is a perspective representation of a further exemplary embodiment of the semiconductor component 1. The mounting side 23 is provided, as is also possible in all the other exemplary embodiments, with a metallic or dielectric mirror layer 6. The mirror layer 6 may completely cover the mounting side 23, with the exception of regions on which the semiconductor chips 3 are located.

According to FIG. 2, the mounting side 23 is free of any luminescent material 5. Such a luminescent material may already be integrated into the semiconductor chips 3. Alternatively, it is possible for the semiconductor chips 3 to emit in three different colors. For example, red light-, green light- and blue light-emitting semiconductor chips 3 are used.

FIGS. 3A and 3B show sectional representations of an exemplary embodiment of the semiconductor component 1. Between the semiconductor chips 3 and the optical element 2 is located a filling medium 29, which is formed for example from a silicone. This results in better optical coupling of the semiconductor chip 3 to the optical element 2. Such a filling medium 29 may also be present in all the other exemplary embodiments.

FIG. 3B shows that the light outlet side 22 of the optical element 2 comprises a concavely curved and a convexly curved region. This enables beam expansion in a direction perpendicular to the longitudinal axis A. The progress of radiation R out of the semiconductor chip 3 is shown schematically in FIG. 3B by arrowed lines.

In the exemplary embodiment of the semiconductor component 1 as shown in perspective representation in FIG. 4, the conductor tracks 4 are guided such that electrical connection is possible via a plug connector 9 on the mounting side 23 in the region of just one of the end faces 28. Such plug connectors 9 may also be present in all other exemplary embodiments. The plug connector 9 makes it possible to bring about external electrical and also mechanical fastening of the semiconductor components 1. Unlike in the representation, it is also possible for the plug connector 9 to be mounted directly on one of the end faces 28 or on both end faces 28, in order to allow a plurality of semiconductor components 1 to be plugged together along the longitudinal axis A.

Furthermore, a protective device 8 is optionally additionally mounted on the mounting side 23 to protect against damage from electrostatic discharges. As an alternative or in addition to the protective device 8, other electrical components such as control chips may also be mounted. Likewise unlike in the representation, it is possible for the semiconductor chips 3 to be electrically individually drivable or to be connected into individually electrically drivable groups. In this way, a color location emitted by the semiconductor component 1 when in operation may for example be purposefully adjusted.

Figure 5:
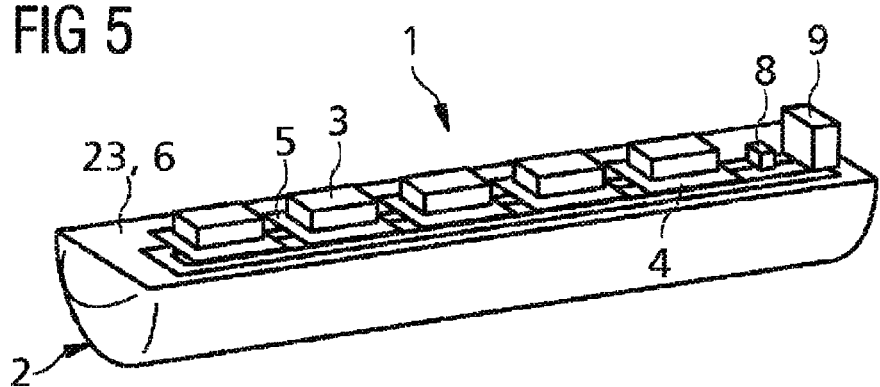
FIG. 5 shows a perspective representation of another exemplary embodiment of the semiconductor component.

In the exemplary embodiment according to FIG. 5, the luminescent material 5 is applied only in regions on the mounting side 23 in which the semiconductor chips 3 are located. Remaining regions of the mounting side 23 may be optionally covered with the mirror layer 6.

Figure 6:
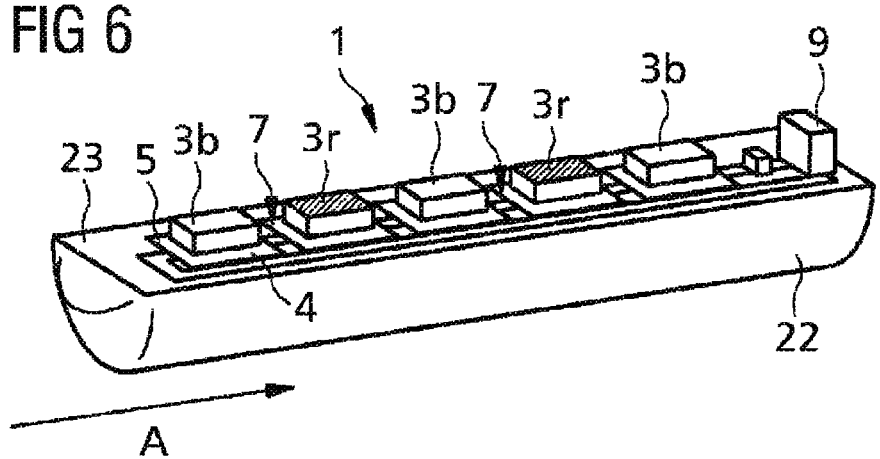
FIG. 6 shows a schematic representations of yet another exemplary embodiments of optoelectronic semiconductor component.

The semiconductor component 1 as shown in FIG. 6 comprises red light-emitting semiconductor chips 3r and blue light-emitting semiconductor chips 3b. The semiconductor chips 3b, 3r are mounted alternately in the longitudinal direction A. Between the blue-emitting semiconductor chips 3b and the optical element 2 there is in each case located at least one luminescent material 5, for example YAG:Ce.

Between the red-emitting semiconductor chips 3r and the optical element 2, a scattering medium 7 is applied in each case in places. Such a scattering medium 7 may also be present in all other exemplary embodiments. Unlike in the Figure, it is possible, as also in all other exemplary embodiments, for the scattering medium 7 to completely cover the mounting side 23. Alternatively or in addition, the scattering medium 7 may be applied in places or over the entire surface of the light outlet side 22, in particular for the purpose of glare suppression.

Figure 7:
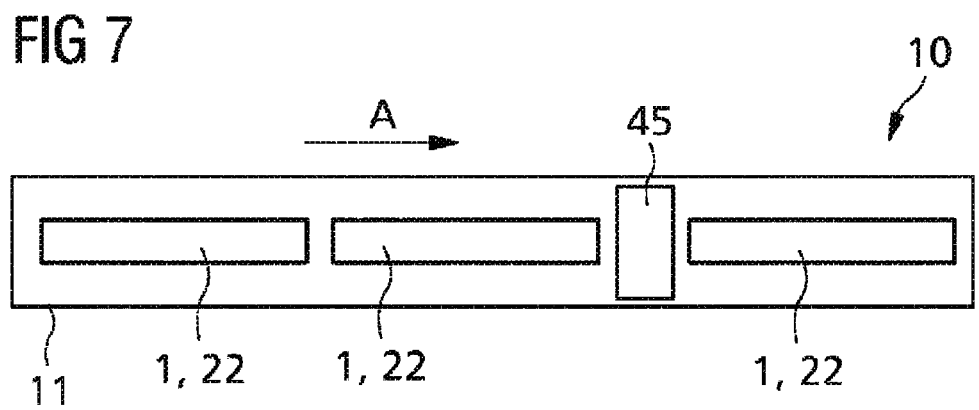
FIG. 7 shows a schematic plan view onto an arrangement with optoelectronic semiconductor components described here, and FIG. 8, which includes

FIG. 7 shows an arrangement 10 with a plurality of semiconductor components 1. To simplify the representation, conductor tracks respectively between the individual semiconductor components 1 are not shown in FIG. 7. The semiconductor components 1 are mounted on a common carrier 11. Also optionally located on the carrier 11 is the driving electronics 45. The arrangement 10 is, for example, a replacement for a fluorescent tube. The spatial dimensions of the arrangement 10 are however preferably smaller than the dimensions of a conventional fluorescent tube, in particular in a direction perpendicular to longitudinal axis A.

FIGS. 8A to 8C are sectional representations and plan views of exemplary embodiments of the optical element 2. The optical elements 2 each comprise concavely and convexly curved regions along cross-sections perpendicular to the longitudinal direction A and also parallel to the longitudinal direction A, said regions alternating in particular periodically along the longitudinal direction.

The left-hand parts of FIGS. 8A to 8C in each case show a sectional representation perpendicular to the longitudinal axis A. The representations at the top right in FIGS. 8A to 8C are sectional representations along the longitudinal axis A. At bottom right FIGS. 8A and 8B represent plan views of the optical elements 2 and FIG. 8C represents views from below.

FIGS. 8A and 8B show that the optical element 2, when viewed in plan view onto the light outlet side 22, in each case comprises peaks and troughs. An indentation is preferably formed in the peak portions, which is surrounded by "embankments" formed of a material of the optical element 2.

Blind holes 25 may be formed in the mounting sides 23, see FIG. 8C. The blind holes 25 are configured to receive the semiconductor chips, not shown in FIGS. 8A to 8C. Preferably precisely one blind hole 25 for one of the semiconductor chips is provided per periodic length of the optical element 2 along the longitudinal axis A. Such blind holes 25 may also be present in all other exemplary embodiments.

In the sectional representations perpendicular to the longitudinal axis A in FIGS. 8A to 8C, possible dimensions for the optical element 2 are indicated in each case by way of example. The representations in FIGS. 8A to 8C should be understood in this respect as being to scale. The stated dimensions apply for example in each case with a tolerance of at most a factor of 3 or 2 or 1.5 or 1.25. The dimensional ratios relative to one another in each case preferably apply with a tolerance of at most a factor of 2 or 1.5 or 1.15.

The following advantages are achieved in particular by a production method described here and by the semiconductor components 1 described here:

In various embodiments no printed circuit board, or PCB, is needed to interconnect the semiconductor chips.

In various other embodiments production proceeds with only little processing effort and is flexibly configurable, in particular optical elements of different lengths can be produced without major changes to the process.

The entire process can be performed during the cooling phase and glass rod production for the optical element, i.e. an "on the fly" process can be achieved.

In various embodiments the production sites have only a small space requirement and no additional transport effort has to be undertaken between production processes.

In yet other embodiments different geometries of the optical element 2 can be simply produced using different forming rollers. This allows different emission patterns of the semiconductor components 1 to be simply produced and adjusted for different applications.

In some embodiments the dimensions of the semiconductor components described here are significantly smaller than the dimensions of conventional systems, in particular smaller than the dimensions of normal fluorescent tubes.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

The invention claimed is:
1. A method for producing optoelectronic semiconductor components, the method comprising:
   A) creating a blank by pultrusion from a glass melt;
   B) shaping the blank into a billet-shaped optical element with a longitudinal axis, the optical element having a mounting side and a light outlet side;
   C) producing conductor tracks on the mounting side;
   D) mounting a plurality of optoelectronic semiconductor chips on the mounting side of the optical element and connecting them to the conductor tracks; and
   E) separating the optical element into the optoelectronic semiconductor components,
   wherein each optoelectronic semiconductor component comprises at least two of the semiconductor chips,
   wherein at least steps A) to D) are performed in the stated sequence, and
   wherein at least steps B) and C) take place during cooling at a temperature of at least 110° C.

2. The method according to claim 1, wherein the temperature is at least 140° C.

3. The method according to claim 1, wherein the blank is homogeneous with regard to its material composition after step A) such that no fluctuations in material composition occur.

4. The method according to claim 1, wherein producing the conductor tracks comprises: printing the conductor tracks on the mounting side with an ink containing silver particles; and
   sintering the conductor tracks using the temperature of the optical element, wherein no additional heat is introduced.

5. The method according to claim 1, further comprising applying at least one luminescent material to the mounting side at least in places between steps B) and C), wherein the luminescent material sinks at least partly into the blank.

6. The method according to claim 5, wherein applying at least one luminescent material comprises performing applying the at least one luminescent material at a temperature of between 400° C. and 600° C. inclusive.

7. The method according to claim 5, wherein the luminescent material or at least one of the luminescent materials is or comprises a nitride or an oxynitride, and wherein at least the luminescent material is present in form of particles with an average diameter of between 3 µm and 25 µm inclusive.

8. The method according to claim 1, wherein the mounting side is planar or has a radius of curvature of at least 25 mm.

9. The method according to claim 1, further comprising forming a plurality of blind holes in the mounting side, wherein, in step D), each semiconductor chip is introduced into one of the blind holes.

10. The method according to claim 1, wherein, in step B), the blank is shaped with structured forming rollers such that along the longitudinal axis a cross-section of the optical element, perpendicular to the longitudinal axis, varies periodically.

11. The method according to claim 10, wherein the optical element comprises respectively concavely and convexly curved regions of the light outlet side both in a cross-section parallel to the longitudinal axis and in a cross-section perpendicular to the longitudinal axis.

12. The method according to claim 1, further comprising applying a mirror layer to the mounting side at least in regions which are not covered by the semiconductor chips.

13. The method according to claim 1, wherein red-emitting semiconductor chips and blue-emitting semiconductor chips are arranged alternately along the longitudinal axis, wherein a scattering medium for light scattering is located in each case between the red-emitting semiconductor chips and the light outlet side and at least one luminescent material is located in each case between the blue-emitting semiconductor chips and the light outlet side, and wherein protective devices to protect against damage from electrostatic discharges and plug connectors for connection of the semiconductor components are mounted on the mounting side in or after step D).

14. The method according to claim 1, wherein step E) takes place directly after or in step B), and wherein end faces of the optical element are provided with a convex curvature.

15. The method according to claim 1, wherein the optical element is a mechanically load-bearing part of the semiconductor components.

16. An optoelectronic semiconductor component, wherein a semiconductor component is produced by the method according to claim 1, wherein the semiconductor component comprises at least two of the semiconductor chips, wherein the semiconductor chips are arranged along the longitudinal axis of the optical element, wherein a length and width of the optical element are equal to a length and width of the semiconductor component, when viewed in plan view onto the mounting side, wherein the length exceeds the width by at least a factor of 8, and wherein the optical element is the only mechanically load-bearing part of the semiconductor component.

* * * * *